United States Patent [19]

Takeuchi et al.

[11] Patent Number: 5,067,904

[45] Date of Patent: Nov. 26, 1991

[54] IC SOCKET

[75] Inventors: Shigeru Takeuchi, Takasaki; Takayuki Murayama; Motokuni Horiguchi, both of Kodaira; Masami Hukunaga, Kawaguchi, all of Japan

[73] Assignees: Kabushiki Kaisha Hitachi Seisakusho, Tokyo; Hitachi Micro Computor Engineering Kabushiki Kaisha, Kodaira; Enplas Corporation, Namiki Kawa Guchi, all of Japan

[21] Appl. No.: 593,305

[22] Filed: Oct. 3, 1990

Related U.S. Application Data

[63] Continuation of Ser. No. 139,347, Dec. 29, 1987, abandoned.

[30] Foreign Application Priority Data

Dec. 29, 1986 [JP] Japan .................................. 61-20011
May 1, 1987 [JP] Japan ................................ 62-109294

[51] Int. Cl.⁵ .............................................. H05K 1/00
[52] U.S. Cl. ........................................ 439/73; 439/72

[58] Field of Search ...................................... 439/78-83, 439/68-73, 325, 525, 856, 857, 861, 862

[56] References Cited

U.S. PATENT DOCUMENTS

| 4,266,845 | 5/1981 | Ishikawa | 439/862 |
| 4,268,102 | 5/1981 | Grabbe et al. | 439/70 |
| 4,354,729 | 10/1982 | Grabbe et al. | 439/862 |
| 4,370,012 | 1/1983 | Grabbe et al. | 439/862 |
| 4,491,382 | 1/1985 | Ishikawa | 439/839 |

Primary Examiner—David L. Pirlot
Attorney, Agent, or Firm—David O'Reilly

[57] ABSTRACT

A contact pin aligned in an IC socket body can be made by stamping, the pin comprising a base, a connecting terminal, a first contacting piece provided at the corresponding position to said connecting terminal and having a slanted or vertical contacting face, a second contacting piece connected to said base through a spring part, and a contacting face to make a conductive contact with the other face. The second contacting face can instead be angular to make a linear contact.

6 Claims, 4 Drawing Sheets

IC SOCKET

This is a continuation of co-pending application Ser. No. 07/139,347 filed on Dec. 29, 1987 now abandoned.

FIELD OF THE INVENTION

This invention relates to an IC sock,et for testing and measuring IC circuits in an IC package such as a flat type IC package, which socket is particularly suitable for high frequency characteristics.

BACKGROUND OF THE INVENTION

As shown in FIG. 5, a known flat type IC package is in the shape of flat rectangular parallelpiped. Lead terminals 2 are aligned at the edge. In FIG. 5, these lead terminals project like legs of a centipede, but they may instead by round shaped loops.

A known IC socket 4 for testing said flat type IC package 1, as shown in FIGS. 5, 6, has a socket body 6 having a depression 5 for inserting the IC package 1, contact pins 3 planted on the socket body 6 and a cover 7 pivoted on the socket body 6 for pressing the IC package 1 or lead terminals 2 so as to contact the lead termianals 2 to contact pins 3 respectively. Cover 7 is locked in a closed position a lock lever 8 which is provided on the socket body 6 as shown in FIG. 5 or the cover 7 as shown in FIG. 6.

Said contact pins 3 are formed by stamping a thin resilient sheet metal plate, which are provided in the socket body 6 so as to correspond to said lead terminals 2. It is usual to form the upper part of the contact pin 3 to a hairpin like shape for resilient contact with lead terminal 2.

However, this shape of the contact pin 3 makes a loop circuit and it creates a longer circuit and high self-inductance circuit in the order of 10 nH. This high self-inductance hinders accurate measuring of high frequency characteristics, especially in the high frequency range above 100 MHz. U.S. Pat. No. 4,354,729 proposes a contact pin which forms a linear circuit, but it damaoes the lead terminal of the IC package due to slipping between them, and needs a step for preloading the spring arm in manufacturing.

BRIEF DESCRIPTION OF THE INVENTION

The object of this invention is to eliminate this drawback by providing a contact pin which can be made simply by stamping and forms a linear circuit without damaging the lead terminal of the IC package.

The above and other features of this invention will be fully understood from the following detailed description and the accompanying drawings, in which:

DETAILED DESCRIPTION OF THE INVENTION

Figure 1:
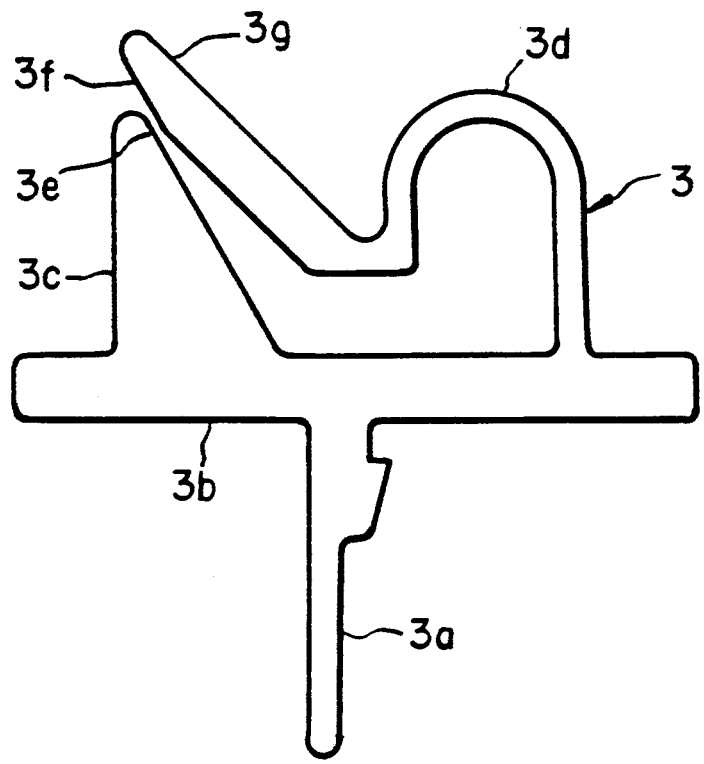
FIG. 1 shows an elevation view of a contact pin according to the first embodiment of this invention.

FIG. 1 shows a contact pin 3 according to a first and preferred embodiment of this invention, in which a connecting terminal 3a of contact pin 3 extends downwardly perpendicular to a base 3b. A first contacting piece 3c is a triangular plate extending upwardly from the upper edge of the base 3b at the same position to the connecting terminal 3a. The slanted edge of the contacting piece 3b forms a contacting face 3e. The angle between contacting face 3e and base 3b is 60 degrees in this embodiment, but may be in the range between 45 degrees and 90 degrees.

A spring part 3d extends upwardly from the upper edge of base 3b and bends in a semi-circular shape. A second contacting piece 3g extends upwardly from the end of spring part 3d in an oblique direction at about 40–50 degrees, preferably 45 degrees. The lower edge forms a second contacting face 3f. Second contacting face 3f is parallel to the first contacting face 3e in its relaxed condition and the distance between these faces 3f, 3e is between 0.1 and 0.3 mm, preferably 0.2 mm.

Said contact pin 3 is an integral piece stamped from a Be CuP metal plate of thickness 0.3 mm. The plate is plated by Ni of more than 2 um thickness and plated by Au of more than 2 um thickness over the Ni plated layer.

The dimensions of each parts are as follows;

| contacting terminal 3a | length 5.2 mm | width 0.5 mm |
| base 3b | length 1.0 mm | width 10.5 mm |
| first contacting piece 3c | height 3.7 mm | bottom 2.5 mm |
| spring part 3d | width 0.4 mm | radius 1.1 mm |
| second contacting piece 3g | width 0.8 mm | length 5.0 mm |

Operation of this embodiment is as follows. When the upper end of second contacting piece 3g is contacted by the lead terminal 2 of the IC package 1 and pressed downwardly, spring part 3d is bent downwardly and contacting face 3f contacts the contacting face 3e. It then slides along the face 3e by bending the spring part 3d. Therefore the first and second contacting pieces 3c and 3g are held in contact, and the second contacting piece 3g moves up and down in contact with the lead 2 of the IC package without slipping so that the lead 2 is not damaged.

Electric current flows from or to lead 2 through second contacting piece 3g, first contacting piece 3c, base 3b and contacting terminal 3a. Therefore the circuit is short and linear so that the self-inductance is small, less than 5 nH, and the high frequency character of the IC package can be measured accurately.

Figure 1A:
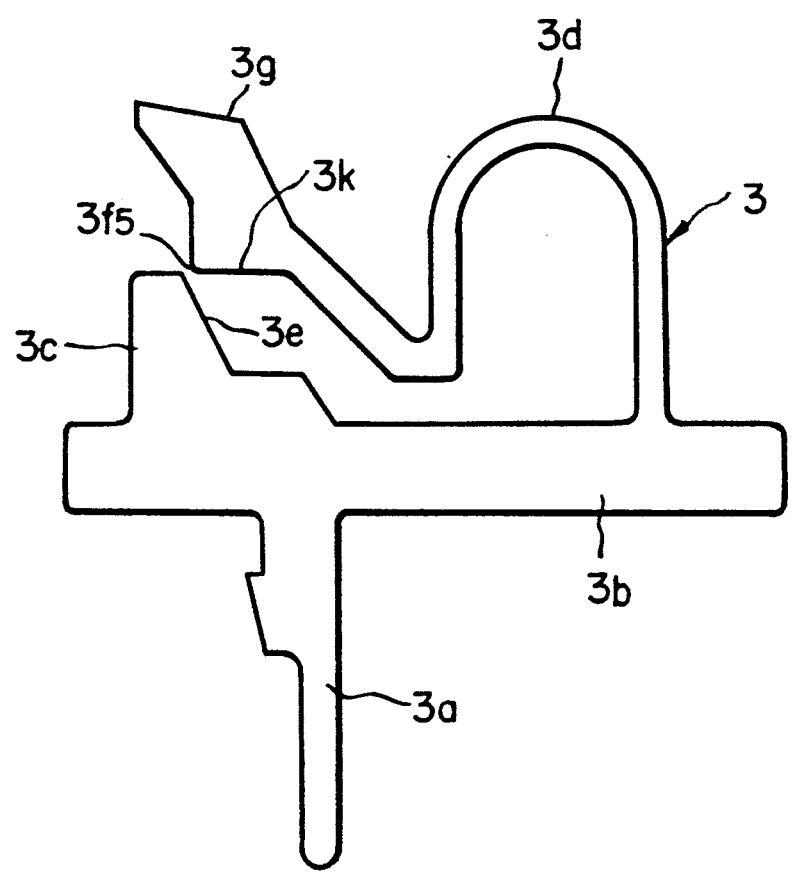
FIG. 1(a) shows a variation of the embodiment of FIG. 1, and the presently preferred form.

In FIG. 1a, instead of forming contacting face 3f as a flat surface, its contact region is formed as the apex of an angle so as to make a linear contact which will, of course, have some width. It is relieved at both sides. This assures that when the IC package is removed, the contacting surfaces will separate, because there is less risk of an angular interference that might hold them together, which is an occasional risk in the embodiment of FIG. 1.

Figure 2:
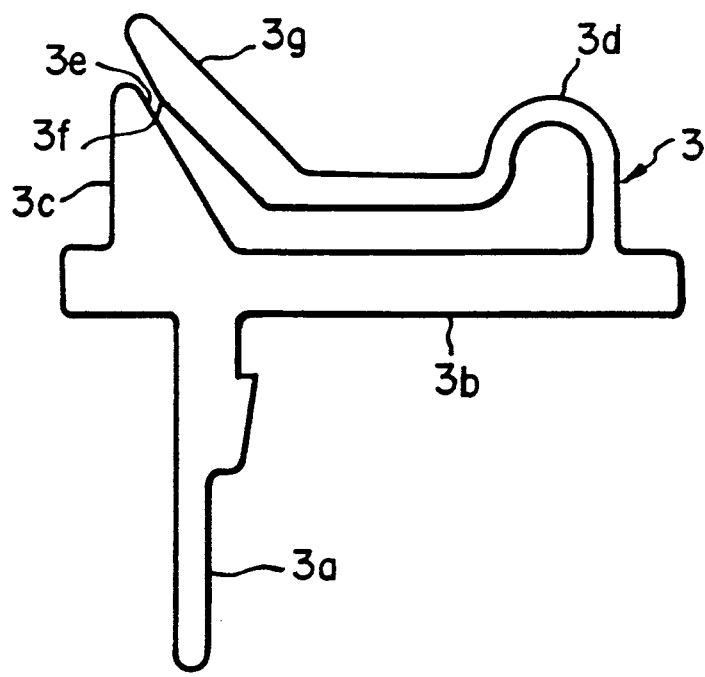
FIG. 2 shows an elevation view of a contact pin according to a second embodiment of this invention.

FIG. 2 shows a contact pin 3 according to a second embodiment of the invention, which is almost the same shape as said first embodiment, but the distance between first contacting piece 3c and spring part 3d is wider, and the second contacting piece 3g extends in a lateral direction.

The dimensions of the parts are as follows;

| contacting terminal 3a | length 5.5 mm | width 0.5 mm |
| --- | --- | --- |
| base 3b | length 1.0 mm | width 9.6 mm |
| first contacting piece 3c | height 2.5 mm | bottom 1.8 mm |
| spring part 3d | width 0.4 mm | radius 0.65 mm |
| second contacting piece 3g | width 0.7 mm | oblique length 3.7 mm |
| | | lateral length 3.5 mm |

In said embodiments, contacting face 3f of the second connecting piece is linear, but the face may be semi-circular, hump-shaped, or indented-shaped.

Figure 3:
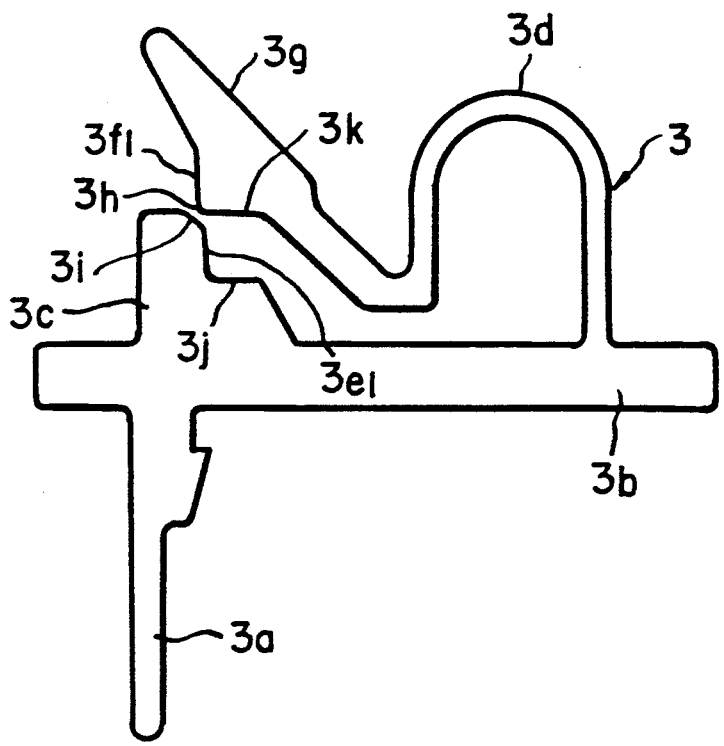
FIG. 3 shows an elevation view of a contact pin according to a third embodiment of this invention.

FIG. 3 shows a contact pin 3 according to a third embodiment of this invention which is almost the same shape as said previous embodiments, and only the different parts are explained. The Contacting faces 3e1, 3f1 are parallel to each other, and normal to base 3b, continuously communicating with horizontal stopper faces 3j, respectively, and overlapping 0.1–0.2 mm, preferably 0.1 mm with each other. Faces 3j,3k are leading faces.

The dimensions of each parts are as follows;

| contacting terminal 3a | length 5.2 mm | width 0.5 mm |
| --- | --- | --- |
| base 3b | length 1.0 mm | width 10.5 mm |
| first contacting piece 3c | height 2.0 mm | bottom 2.5 mm |
| spring part 3d | width 0.3 mm | radius 1.2 mm |
| second contacting piece 3g | width 0.6 mm | length 6.0 mm |

Operation of this embodiment is as follows. When the upper end of the second contacting piece 3g is contacted by lead terminal 2 of the IC package 1 and pressed downwardly, spring part 3d is bent downwardly. At first, face 3h contacts face 3i. Then spring part 3d is bent to the right in the figure. After this, contacting face 3f1 contacts contacting face 3e1. It then slides along face 3j by bending the spring part 3d. Therefore the first and second contacting pieces 3c,3g are held in contact and second contacting piece 3g moves up and down, contacting lead of the IC package without slipping. Lead 2 is therefore not damaged.

Electric current flows from or to lead 2 through second contacting piece 3g, first contacting piece 3c, base 3b, and terminal 3a. Therefore the circuit is short and linear so that self inductance is small, less than 3–5 nH, and the high frequency characteristics of the IC package can be measured accurately.

Figure 4A:
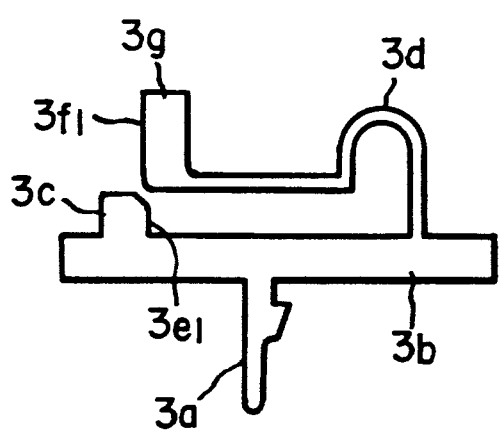
FIG. 4(a) shows an elevation of a contact pin according to a fourth embodiment of this invention.

FIG. 4(a) shows a contact pin 3 according to a fourth embodiment of this invention. It is almost the same shape as said previous embodiments so that only different parts are explained. The distance between first contacting piece 3c and spring part 3d is wider, and the second contacting piece 3g extends in a lateral direction.

Figure 4B:
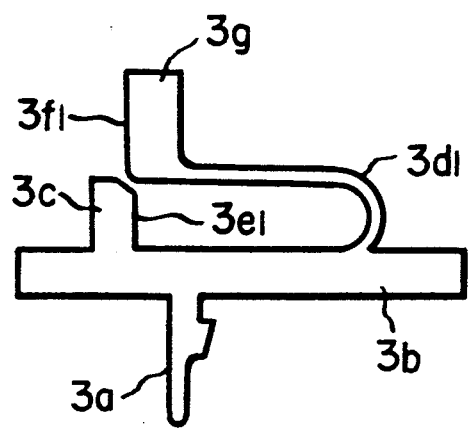
FIG. 4(b) shows an elevation of a contact pin according to a fifth embodiment of this invention.

FIG. 4(b) shows a contact pin 3 according to a fifth embodiment of this invention, in which a spring part 3d1 is normal compared to previous embodiments.

Figure 4C:
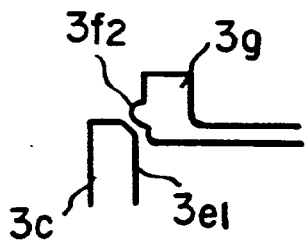
FIG. 4(c) shows an elevation of a contact pin according to a sixth embodiment of this invention.

FIG. 4(c) shows a contact pin 3 according to a sixth embodiment of this invention, in which a contact face 3f2 is a semi circular projection.

Figure 4D:
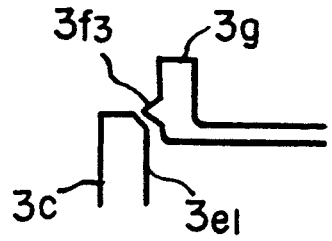
FIG. 4(d) shows an elevation of a contact pin according to a seventh embodiment of this invention.

FIG. 4(d) shows a contact pin 3 according to a seventh embodiment of this invention, in which a contact face 3f3 is a hump-shaped projection.

Figure 4E:
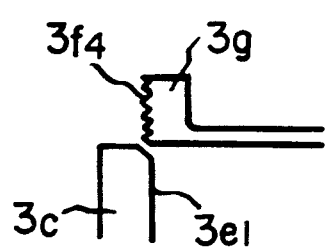
FIG. 4(e) shows an elevation of a contact pin according to an eighth embodiment of this invention.
Figure 5:
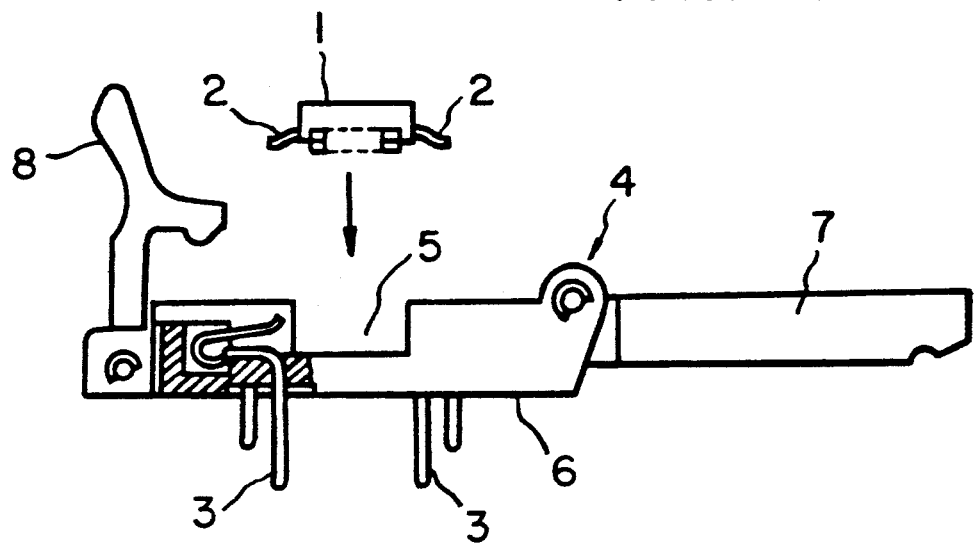
FIG. 5 shows an elevation of a IC Socket and IC package according to the prior art, partly in cross-section.
Figure 6:
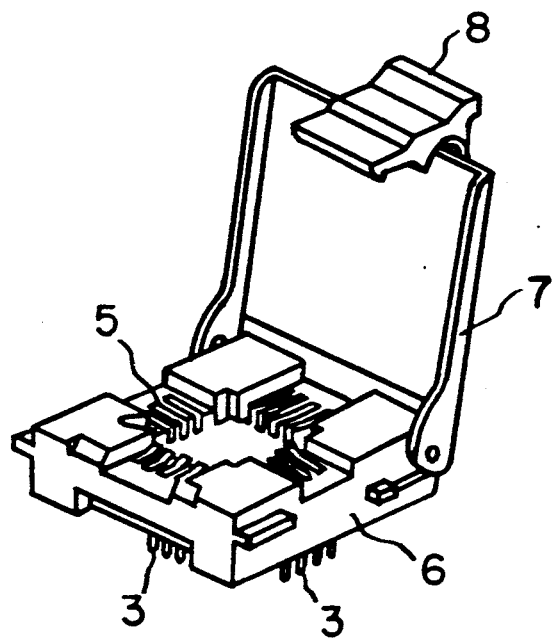
FIG. 6 shows a perspective view of another IC socket of the prior art.

FIG. 4(e) shows a contact pin 3 according to an eight embodiment of this invention, in which contact face 3f4 is an indented shape.

This invention is not to be limited by the embodiments shown in the drawings and described in the descriptions, which are given by way of example and not of limitation, but only in accordance with the scope of the appended claims.

I claim:

1. An IC socket having a socket body, a cover and contact for testing an IC package having lead terminals, that make point to point contact when pressed down on contact pins by closing said cover, said contact pins comprising:

a base;

a connecting terminal extending beneath said base;

a first contacting piece extending upward from said base;

a single semi-circular spring extending upward from said base;

a second contacting piece constructed to rpovide an end to be pressed down by the end of a terminal fo said IC package, said second contacting piece extending outward from said semi-circular spring toward said first contacting piece; said first and second contacting pieces having first and second contacting faces in close proximity but spaced from each other when said semi-circular spring is in a relaxed condition; said first and secone contacting pieces constructed and arranged to provide a short linear connecting path between said connecting terminal and said second contacting piece when said contacting faces are in contact; at least one of said contacting faces being at oblique angle to the base; whereby when the end of a lead terminal of said IC package presses down on an outer end of said second contacting piece; said first and second faces come into sliding contact.

2. The socket according to claim 1 in wh ich at least a portion of said first contacting face on said first contacting piece is at an oblique angle; said second contacting face on said second contacting piece being substantially parallel to said first contacting face whereby said second contacting face will make sliding contact with said first contacting face.

3. The socket according to claim 2 in which said contacting piece extending upward from said base is a triangular piece extending upward from said base with one side of said triangular piece forming said oblique first contacting face.

4. The socket according to claim 2 in which a portion of said second contacting face has an angular portion extending toward said first contacting face; the contacting portion of said second contacting face being at the apex of said angular portion.

5. The socket according to claim 4 in which said oblique portion of said first contacting face on said first contacting piece is a beveled corner of said contacting piece.

6. The socket according to claim 5 in which said angular portion on said second contacting face and a portion of said contacting piece extending upward from said base have mutually opposing surfaces substantially perpendicular to said base; said mutually opposing surfaces contacting when a terminal of an IC presses downward on said second contacting piece; said second contacting face having an angled portion extending outward from the perpendicular surface which mates with the beveled first contacting face on said first contacting piece to displace said mutually opposing perpendicular surfaces away from each other when a terminal of said IC package exerts a downward pressing force on saaid second contacting piece.

* * * * *